(12) United States Patent
Gazzola et al.

(10) Patent No.: US 7,751,726 B1
(45) Date of Patent: Jul. 6, 2010

(54) AUTOMATIC SELECTION OF THE PERFORMANCE MONITORING BASED ON CLIENT TYPE

(75) Inventors: Maurizio Gazzola, Milan (IT); Emanuela Grandi, Pavia (IT); David Bianchi, Cambiago (IT); Stefano Binetti, Monza (IT); Luca Della Chiesa, Milan (IT)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 12/401,118

(22) Filed: Mar. 10, 2009

Related U.S. Application Data

(63) Continuation of application No. 10/602,503, filed on Jun. 24, 2003.

(51) Int. Cl.
*H04B 10/06* (2006.01)
(52) U.S. Cl. .................. 398/202; 398/173; 398/154; 398/155; 398/208; 398/212; 398/175; 398/177; 398/180; 398/25
(58) Field of Classification Search .................. 398/25, 398/173–180, 202, 212, 214, 154, 156, 208
See application file for complete search history.

(56) References Cited

U.S. PATENT DOCUMENTS

| | | | |
|---|---|---|---|
| 5,982,837 A | 11/1999 | Earnest | |
| 6,042,332 A | 3/2000 | Kochanowski et al. | |
| 6,178,213 B1 | 1/2001 | McCormack et al. | |
| 6,298,103 B1 * | 10/2001 | Huang et al. | 375/355 |
| 6,381,221 B1 | 4/2002 | Legouet-Camus et al. | |
| 6,426,958 B1 | 7/2002 | Crossett, III et al. | |
| 6,466,886 B1 * | 10/2002 | Marmur | 702/126 |
| 6,631,144 B1 * | 10/2003 | Johansen | 370/516 |
| 6,684,033 B1 | 1/2004 | Doh et al. | |
| 7,050,463 B1 | 5/2006 | Cho et al. | |
| 7,076,177 B1 * | 7/2006 | Yang et al. | 398/208 |
| 2002/0126784 A1 * | 9/2002 | Brazeau et al. | 375/371 |
| 2003/0016423 A1 * | 1/2003 | Cho et al. | 359/189 |

OTHER PUBLICATIONS

Scheytt et al., "A 0.155-, 0.622-, and 2.488-Gb/s Automatic Bit-Rate Selecting Clock and Data Recovery IC for Bit-Rate Transparent SDH Systems," IEEE Journal of Solid State Circuits, vol. 34, No. 12, Dec. 1999, p. 1935-1943.

* cited by examiner

*Primary Examiner*—Li Liu

(57) ABSTRACT

Systems and methods for operating transponders that automatically accommodate multiple received signal types. The different signal types may include different clients such as, e.g., SONET/SDH, G.709, 10 Gigabit Ethernet, etc. as well as different data rates. A transponder can automatically detect the client signal type and data rate and respond by processing the received signal appropriately, notifying a control processor, and invoking an appropriate performance monitoring method. This maximizes the network operator's flexibility and ease of configuration.

15 Claims, 5 Drawing Sheets

AUTOMATIC SELECTION OF THE PERFORMANCE MONITORING BASED ON CLIENT TYPE

This application is a continuation of U.S. patent application Ser. No. 10/602,503, filed on Jun. 24, 2003, the entirety of which is incorporated herein by reference.

BACKGROUND OF THE INVENTION

The present invention relates to optical networking and more particularly, in one embodiment, to reception of multiple signal types.

As service optical transport networks grow and evolve to incorporate more advanced technologies, they increasingly make use of multiple types of optical signal, rather than just one that is standardized across the network. For example, the international SDH standard provided a hierarchy of different optical signals with different data rates including 2.5 Gbps, 10 Gbps, and 40 Gbps. SONET is a North American counterpart to the SDH standard. The G.709 standard specifies another transmission standard with yet another hierarchy of transmission rates. There are also optical transmission standards based on the Gigabit Ethernet standard, such as 10 Gigabit Ethernet.

The network manager thus confronts a wide variety of optical transmission standards, and consequently a wide variety of optical transponders that are responsible for transmitting and receiving the optical signals. Unfortunately, given the inherent compatibility differences between transmission standards, a transponder of one type can only be used with signals of that type. The result is great inflexibility in network configuration. Transponders specified for one signal type can only be used with that signal type and not with other types.

Manufacturers have developed a partial solution in the form of transponders that can accommodate different signal data rates within the same client type such as SONET/SDH, G.709, Gigabit Ethernet, etc. However, manual configuration of the data rate is necessary so that the transponder properly processes the received signal and appropriately monitors signal quality.

It would be desirable to have a multi-rate, multi-client transponder that can automatically adapt to the received signal. This would provide network operators with maximum flexibility and ease of configuration.

SUMMARY OF THE INVENTION

Embodiments of the present invention provide systems and methods for operating transponders that automatically accommodate multiple received signal types. The different signal types may include different clients such as, e.g., SONET/SDH, G.709, 10 Gigabit Ethernet, etc. as well as different data rates. A transponder can automatically detect the client signal type and data rate and respond by processing the received signal appropriately, notifying a control processor, and invoking an appropriate performance monitoring method. This maximizes the network operator's flexibility and ease of configuration.

A first aspect of the present invention provides a method of operating an optical receiver system. The method includes: receiving an optical signal, converting the optical signal to an electrical signal, automatically identifying a clock rate of the electrical signal, and using the identified clock rate to select a signal type of the optical signal from a set of possible signal types.

A second aspect of the present invention provides apparatus for operating an optical receiver system. The apparatus includes a clock recovery block that recovers a clock signal from a received optical signal and a control processor that directs the clock recovery block to attempt to lock to the optical signal using a plurality of clock rates, and that upon achieving lock using a clock rate matching that of the optical signal, employs the matching clock rate to determine a signal type of the optical signal.

A third aspect of the present invention provides apparatus for operating an optical receiver system. The apparatus includes: a clock recovery block that receives a clock signal from a received optical signal and measures a difference of rate between the clock signal and a reference clock, and a control processor that, based on the difference of rate, determines a signal type of the received optical signal.

Further understanding of the nature and advantages of the inventions herein may be realized by reference to the remaining portions of the specification and the attached drawings.

DESCRIPTION OF SPECIFIC EMBODIMENTS

Figure 1:
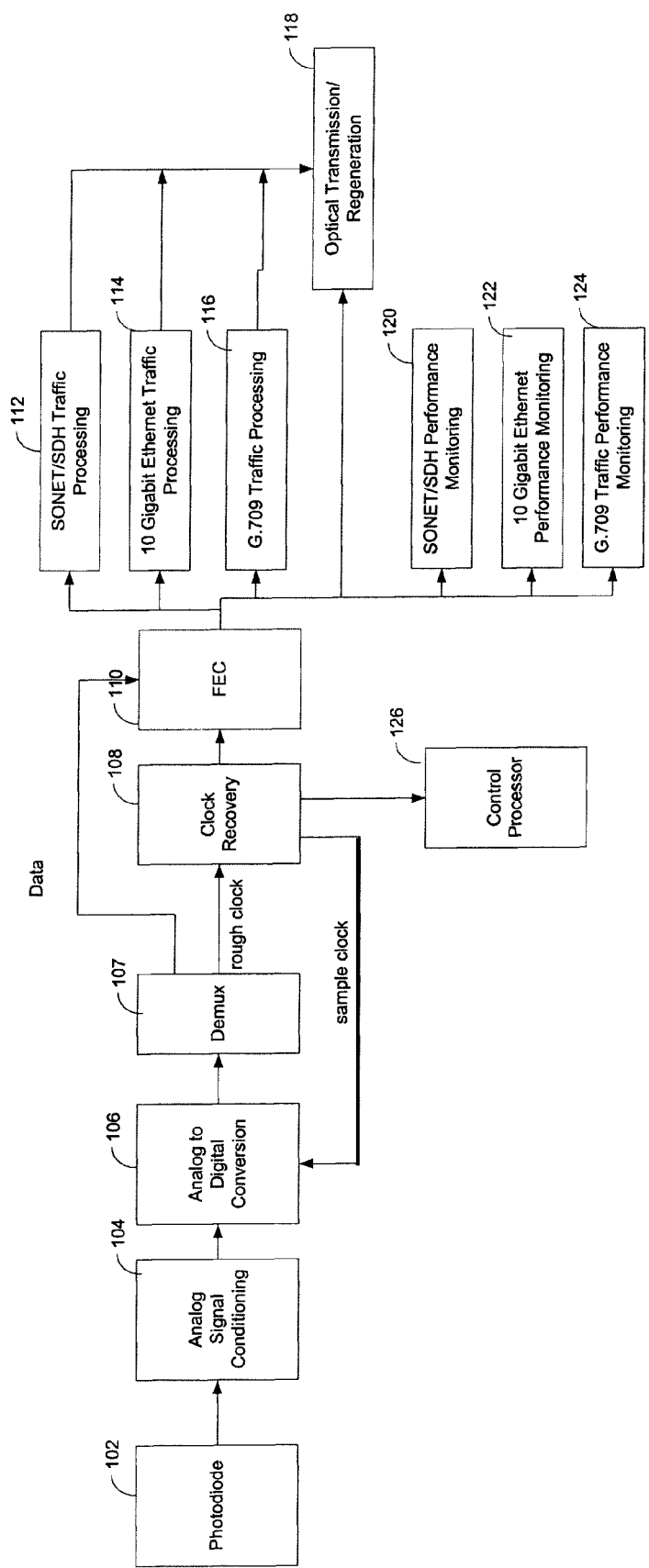
FIG. 1 depicts elements of an optical transponder according to one embodiment of the present invention.

The present invention will be described with reference to an optical transport network (OTN) that uses one or more of a variety of optical signal types and data rates. Different signal types include, e.g., SDH (generally used outside of North America), SONET (generally used in North America), G.709, and 10 Gigabit Ethernet. In addition, the various signal types may encompass multiple possible data rates. The signal types and data rates discussed herein are merely representative of the possible signal types and data rates that can be accommodated.

The SDH, SONET, and G.709 optical transmission standards are specified by a variety of specification documents published by the ITU, ANSI, Telcordia, the EIA, and NSIF (Network and Services Integration Forum). The 10 Gigabit Ethernet Standard is specified by the IEEE. Those of skill in the optical networking art are familiar with the relevant specification documents, the contents of which are herein incorporated by reference for all purposes in their entirety.

An important part of operating an optical transponder is monitoring the signal quality of the received signal. Each optical transmission standard has an associated performance monitoring method.

For the SONET and SDH standards, performance monitoring may involve use of the B1 and/or B2 bytes specified by the standards. These bytes referred to as bit-interleaved parity (BIP) bytes provide a parity check on other received data and facilitate non-intrusive bit error rate testing. The J0 path trace byte may also be used for connection verification. G.709 also employs bit error rate testing based on comparable BIP and path trace bytes. In 10 Gigabit Ethernet, CRC checks can be made on received Ethernet frames. If FEC is being used in G.709, the error detection, decoding and correction processes can themselves provide information about received signal quality.

The results of performance monitoring that are presented to a control processor, control module, management layer entity, etc., can include statistics such as bit error rate statistics, histograms of error counts per frame, statistics of lost or dropped frames, etc. Performance monitoring methods and results are specified by the various transmission standards and by other related documents. For example, details of 10 Gigabit Ethernet performance monitoring results are given by Waldbusser, et al., "Remote Network Monitoring management Information Base," IETF Request for Comments 2819, May 2000, the contents of which are herein incorporated by reference for all purposes in their entirety. SONET, SDH, and G.709 performance parameters and objectives are specified by ITU-T Recommendation G.826 and G.8201, currently under development in the ITU, the contents of which are herein incorporated by reference for all purposes in their entirety.

Embodiments of the present invention provide transponders that include receivers capable of adapting automatically to the client type and data rate of a received signal. In one implementation, the transponder determines the client type and data rate by attempting clock recovery based on the known bit rates of the various candidate signals. Once lock is achieved, the transponder is aware of both the client type and bit rate. Further processing of the received data and performance monitoring is done in accordance with the selected client type and bit rate.

FIG. 1 depicts the receiver portion of a multi-client, multi-rate transponder 100 according to one embodiment of the present invention. In one particular implementation, transponder 100 is capable of handling:

1. Either SONET at OC-192 rate or SDH at STM-64 rate. The rate is 9.99528 Gbps.
2. 10 Gigabit Ethernet. The rate is 10.325 Gbps.
3. 10 Gigabit Ethernet overclocked to provide G.7090H (overhead) and forward error correction (FEC). The rate is 11.09 Gbps.
4. G.709 at OTU-2 rate (10.709 Gbps).

These are of course merely representative choices for client signal and data rate.

An optical signal received by transponder 100 is converted to an analog electrical signal by a photodiode 102. The analog signal is amplified and filtered as necessary by an analog signal conditioning block 104. The next step is conversion to a series of digital samples by an analog to digital conversion block 106. A demultiplexing block 107 converts the serial data stream to a parallel data stream. A clock recovery block 108 recovers a "rough" clock signal based on transitions in the data stream.

A clock recovery block 108 receives this rough clock signal and uses it to recover the clock signal. The clean clock is fed back to provide a sampling clock to analog to digital conversion block 106. Also, the clean clock and data may be forwarded to an FEC (forward error correction) stage 110 that is optionally inserted depending on the detected signal type.

There are three parallel blocks that may receive the data (in some cases corrected by FEC stage 110) and clean clock and use them to process signal traffic. Only one is active depending on the received signal type. A SONET/SDH traffic processing block 112 processes the OC-192 SONET signal or S™-64 SDH signal. Block 112 may, for example, extract payload data from the signal as a whole, or from one or more selected lower data rate TDM channels, for forwarding to another interface. Also, 10 Gigabit Ethernet traffic processing block 114 and G.709 traffic processing block 116 perform similar functions for those traffic types.

Although the discussion here is focused on receiver processing, transponder 100 also typically incorporates an optical transmission block 118. For example, transponder 100 may be operating as part of a SONET/SDH or G.709 add/drop multiplexer (ADM) so that some received traffic is passed through, other received traffic is forwarded to a local interface, and yet other traffic received via a local interface is multiplexed with the pass-through traffic for transmission. For 10 Gigabit Ethernet the received packets can be sent to a switch that routes them appropriately. Alternatively, transponder 100 may omit the traffic processing blocks and optical transmission block 118 simply regenerates the optical signal from the recovered data.

Whether or not traffic is processed locally, transponder 100 typically performs traffic monitoring on the received signal. A SONET/SDH performance monitoring block 120 monitors the SONET/SDH signal in accordance with the relevant performance monitoring standards as described above. A 10 Gigabit Ethernet Performance monitoring block 122 and a G.709 performance monitoring block 124 similarly perform performance monitoring functions for these transmission standards.

A control processor 126 directs signal type detection and selection according to embodiments of the present invention. Control processor 126 directs clock recovery block 108 in varying the expected incoming bit rate until lock is detected, thereby identifying the incoming signal type. Control processor 126 then selects the appropriate traffic processing and performance monitoring blocks and notifies any local management entities such as an OSS entity.

Control processor 126 may be implemented as, e.g., an ASIC, as a programmable logic device, as a general purpose microprocessor or microcontroller, etc., or some combination thereof. The performance monitoring blocks and traffic processing blocks may be similarly implemented. Hardware devices used to implement embodiments of the present invention may execute software stored on one or more memory devices (not shown). The software may also be stored on other computer-readable storage media such as CD-ROMS, floppy disks, etc.

Figure 2A:
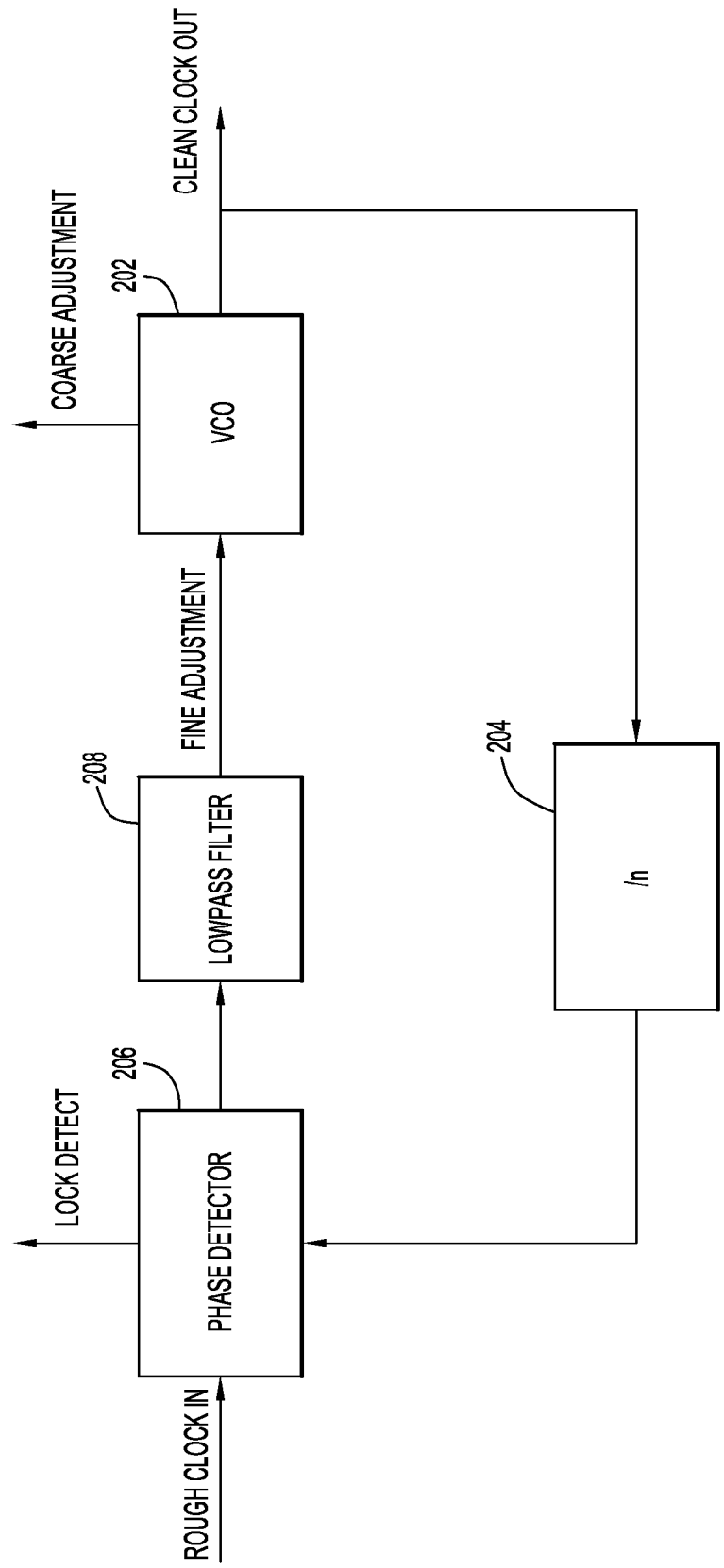
FIG. 2A depicts a clock recovery system according to one embodiment of the present invention.

FIG. 2A depicts one possible internal structure of clock recovery block 108. In FIG. 2A, clock recovery block 108 has a simple phase lock loop (PLL) structure and includes a voltage controlled oscillator 202. A coarse adjustment for voltage controlled oscillator 202 is provided by control processor 126. A fine adjustment for voltage controlled oscillator 202 is provided by the PLL as will be explained.

The output of voltage controlled oscillator 202 is the clean clock signal. To lock it to the rough clock input, the clean clock is fed back through a divide by N block 204 and then to a phase detector 206. Phase detector 206 obtains a phase difference between the clean clock and the rough clock and outputs the difference to a lowpass filter 208. Lowpass filter 208 has a bandwidth of e.g., 3-5 MHz, which sets the capture range and response time of the PLL. The output of lowpass filter 208 represents a fine adjustment to voltage controlled oscillator 202 to bring it into lock. A lock detect output from phase detector 206 indicates when voltage controlled oscillator 202 is locked to the rough clock input. It will be appreciated that the phase detection and filtering functions could be performed using a digital signal processor or other hardware. A numerically controlled oscillator could then substitute for the voltage controlled oscillator.

Figure 3:
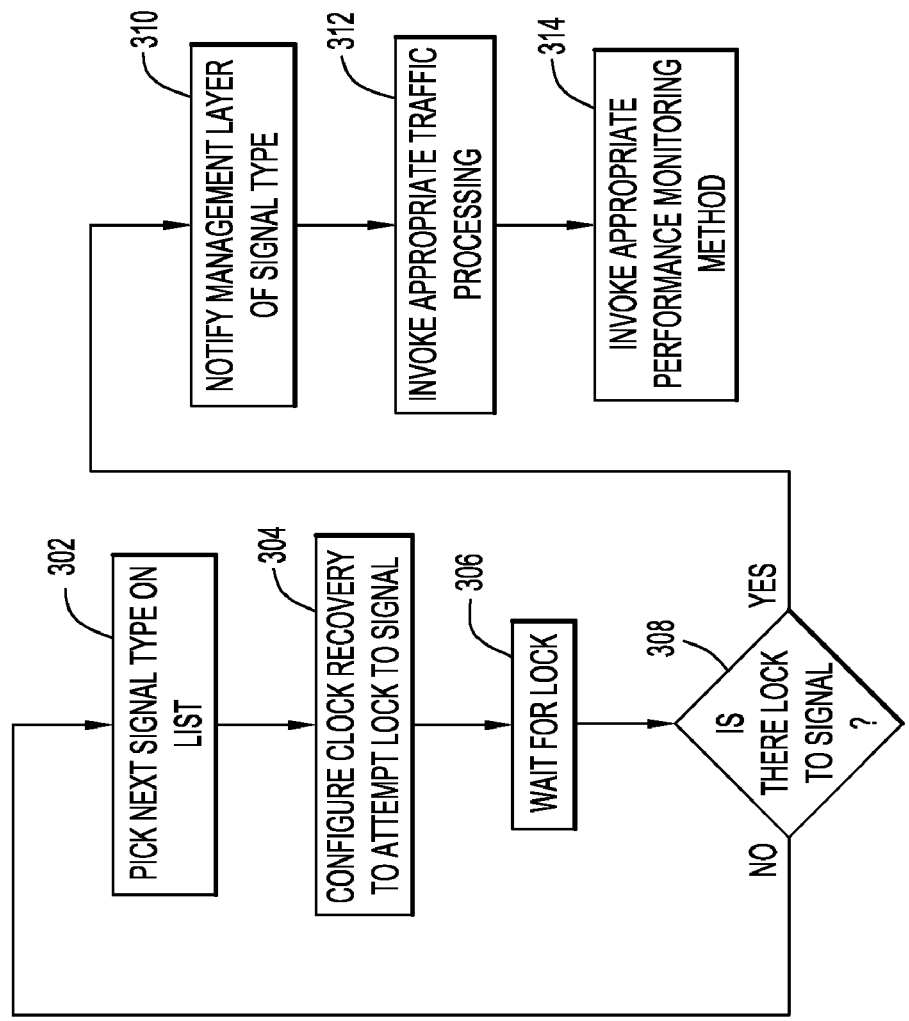
FIG. 3 is a flowchart describing steps of operating a multi-client multi-rate transponder according to one embodiment of the present invention.

FIG. 3 is a flowchart describing steps of operating transponder 100 to detect and select a received signal type employing the implementation of clock recovery block 108 that is depicted in FIG. 2A. Control processor 126 maintains a list of the possible client signal types. At step 302, control processor 126 picks a first signal type on the list. At step 304, control processor 126 configures clock recovery block 108 to attempt to lock to the selected signal type by setting the coarse input of VCO 202 to match the clock rate of the selected signal type. At step 306, control processor 126 waits for a predetermined time interval for a lock indication from clock recovery block 108. The time interval may be, e.g., less than 1 millisecond. A step 308 tests whether lock was in fact achieved. If not was not achieved, control processor 126 proceeds to step 302 to pick the next signal on the list.

If lock was achieved, processing proceeds to step 310 where control processor 126 notifies the management layer of the correct signal type. At step 312, control processor 126 activates the appropriate one of the traffic processing blocks. At step 314, control processor 126 activates the appropriate one of the performance monitoring blocks.

Thus the signal type has been automatically detected based on its measured data rate. Further processing and performance monitoring of the received signal is based on the detected signal type.

Figure 2B:
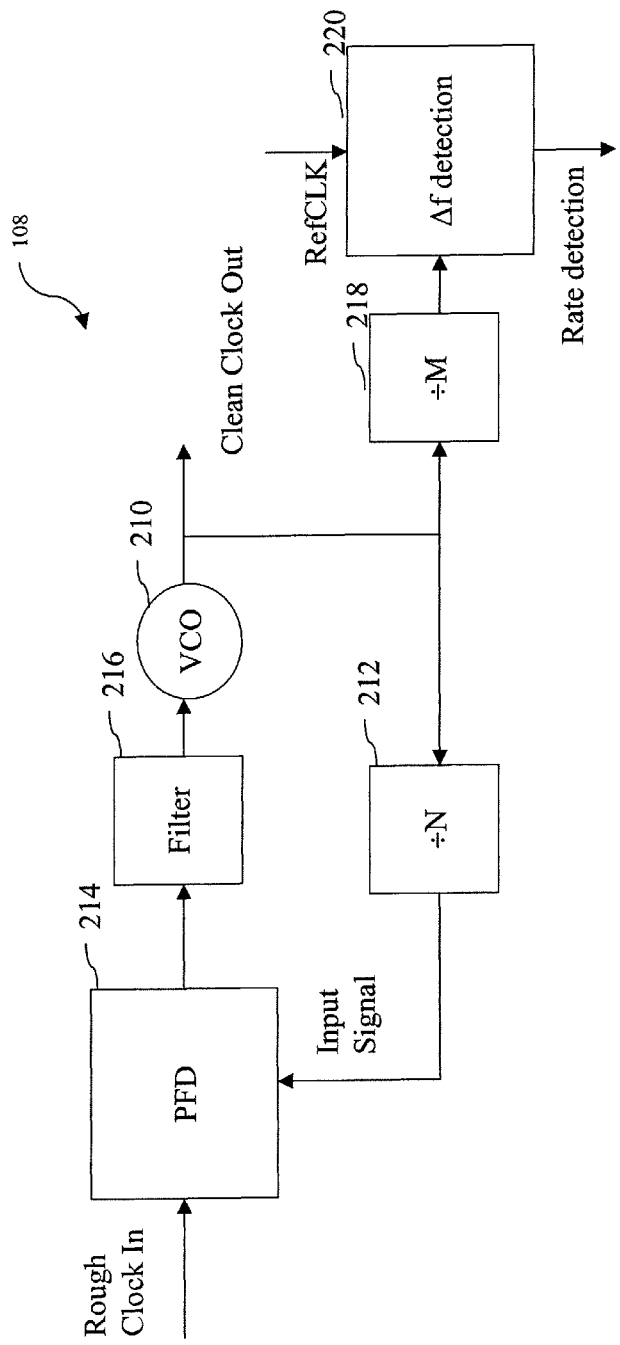
FIG. 2B depicts a clock recovery system that also measures clock rate of an incoming signal according to one embodiment of the present invention.

In an alternative embodiment, clock recovery block 108 itself measures the clock rate of the received signal. FIG. 2B depicts one such implementation of clock recovery block 108. A voltage controlled oscillator (VCO) 210 outputs the clock and is locked to the rough clock input to clock recovery block 108. The output of VCO 210 is fed to a divide-by-N (divides frequency by N) block 212 and then to a phase frequency detector (PFD) 214. Phase frequency detector 214 outputs the phase difference between the divided VCO output and the dirty clock to a lowpass filter 216. Lowpass filter 216 may have a bandwidth of e.g., 3-5 MHz. The output of lowpass filter 216 drives the input of VCO 210 and thus changes its frequency. This clock recovery loop may also be implemented digitally.

The output of VCO 210 is also fed to a divide-by-M block 218. The output of divide-by-M block 218 goes to a delta-f detection block 220 which measures the difference in frequency between the divided VCO output and a reference clock. The difference in frequency indicates the clock rate of the received signal. This clock rate is reported to control processor 126 which uses it to identify the received signal type. Processing then proceeds through steps 310, 312, and 314.

Figure 2C:
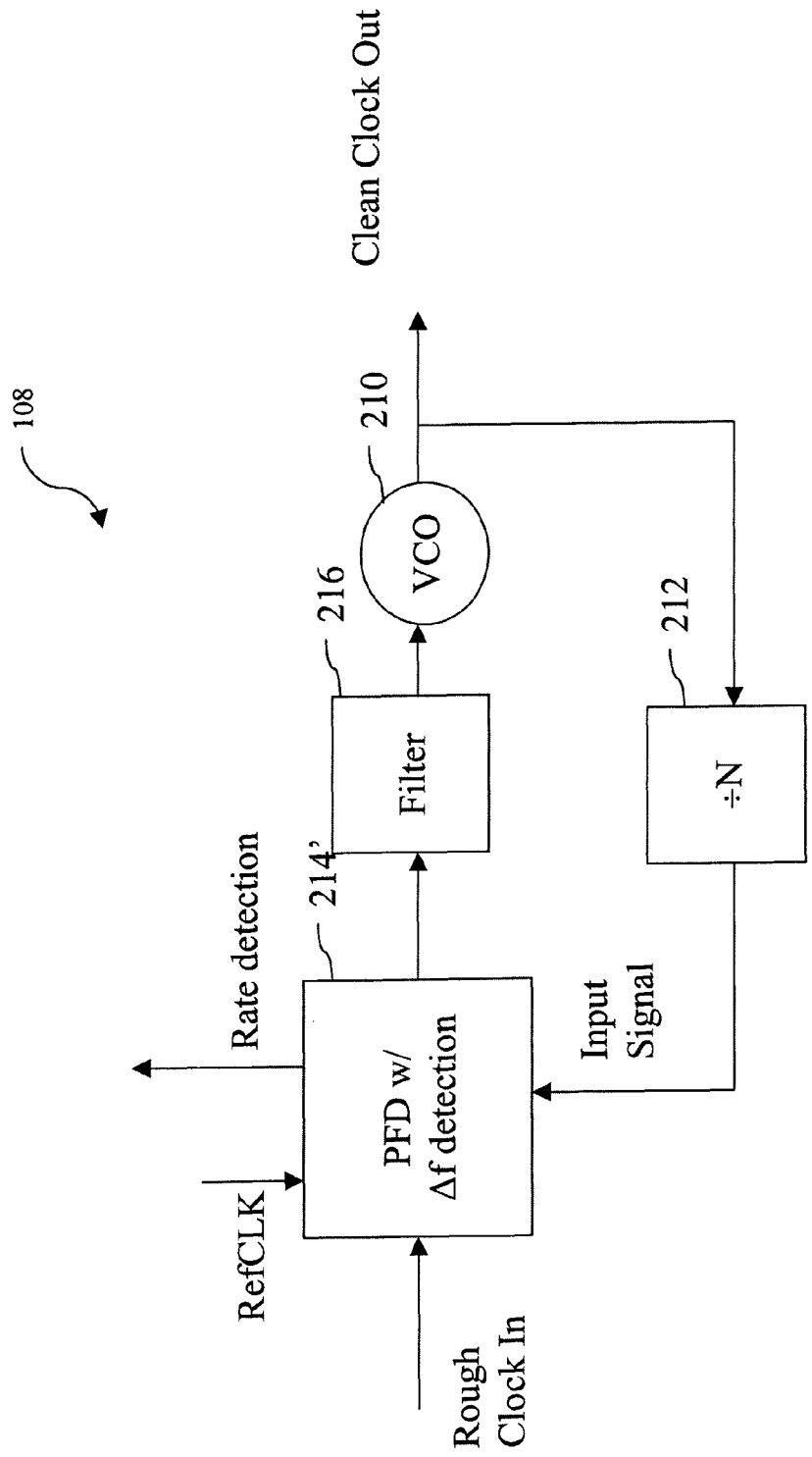
FIG. 2C depicts an alternative clock recovery system that also measures clock rate of an incoming signal according to one embodiment of the present invention.

FIG. 2C depicts an alternative structure for clock recovery block 108. In FIG. 2C, a phase frequency detector 214', in addition to performing the functions of phase 10 frequency detector 214 in FIG. 2B, also determines the rate of the received signal by measuring a rate difference between the output of VCO 210 and a reference clock. Again, this rate is reported to control processor 126.

It is understood that the examples and embodiments that are described herein are for illustrative purposes only and that various modifications and changes in light thereof will be suggested to persons skilled in the art and are to be included within the spirit and purview of this application and scope of the appended claims and their full scope of equivalents.

The invention claimed is:

1. A method comprising:
   receiving an optical signal at an optical receiver device;
   converting said optical signal to an electrical signal;
   storing a list of a plurality of possible optical signal types;
   automatically identifying a clock rate of said electrical signal, wherein said automatically identifying comprises:
   converting the electrical signal to a serial data stream of digital samples;
   demultiplexing the serial data stream to a parallel data stream;
   obtaining a rough clock signal from the parallel data stream;
   applying the rough clock signal to a phase lock loop in a clock recovery circuit to obtain a clean clock signal;
   for a signal type in the stored list, determining a difference between a frequency of the clean clock signal and a frequency of a reference clock;
   determining a clock rate of the received optical signal based on the difference; and
   using the clock rate to identify an optical signal type among the plurality of possible optical signal types of the received optical signal;
   based on the optical signal type determined for the received optical signal, selecting one of a plurality of traffic processing methods to further process said electrical signal, and selecting one of a plurality of performance monitoring methods to monitor quality of said optical signal.

2. The method of claim 1, wherein one of said possible optical signal types comprises an optical signal type selected from the group of: 15 SONET OC-192, SDH STM-64, 10 Gigabit Ethernet having a bit rate of 10.325 Gbps, G.709 having a bit rate of 10.709 Gbps and 10 Gigabit Ethernet employing Forward Error Correction and having a bit rate of 11.090 Gbps.

3. The method of claim 1, wherein automatically identifying comprise applying the clean clock signal to a divide-by-M frequency divider that is configured to divide a frequency of the clean clock signal by M, and applying an output of the divide-by-M frequency divider to a frequency difference detector to measure and output a difference in frequency between the output of the divide-by-M frequency divider and the reference clock, wherein the difference is used for determining a corresponding clock rate from which the optical signal type of the received optical signal is determined.

4. The method of claim 1, wherein automatically identifying further comprises dividing a frequency of the clean clock signal by N with a divide-by-N frequency divider and supplying an output of the divide-by-N frequency divider to a phase frequency detector to measure a rate difference between an output of the divide-by-N frequency divider and the reference clock, wherein the rate difference is used as the difference for the determining a corresponding clock rate from which the optical signal type of the received optical signal is determined.

5. The method of claim 1, wherein determining the difference and determining the clock rate are performed with respect to one optical signal type in the list, and are repeated for other optical signal types in the list until a match is determined with an optical signal type in the list.

6. An apparatus comprising:
   an optical receiver device configured to receive an optical signal and to convert the optical signal to an electrical signal;
   an analog-to-digital converter configured to convert the electrical signal to a serial data stream of digital samples;
   a demultiplexer configured to demultiplex the serial data stream to a parallel data stream and to obtain a rough clock signal from the serial data stream;
   a clock recovery block that is configured to recover a clean clock signal from the rough clock signal; and
   a control processor that is configured to store a list of a plurality of possible optical signal types, to generate a difference between a frequency of the clean clock signal and a frequency of a reference clock, to evaluate the difference to determine a clock rate of the received optical signal and to identify an optical signal type of the received optical signal based on the clock rate;

wherein said control processor, based on the optical signal type determined for the received optical signal, is configured to select one of a plurality of traffic processing blocks to further process said electrical signal, and to select one of a plurality of performance monitoring blocks to monitor quality of said received optical signal.

7. The apparatus of claim 6, wherein the control processor is configured to identify an optical signal type selected from the group of: a SONET OC-192 type of optical signal, SDH STM-64, 10 Gigabit Ethernet having a bit rate of 10.325 Gbps, G.709 having a bit rate of 10.709 Gbps and 10 Gigabit Ethernet employing Forward Error Correction and having a bit rate of 11.090 Gbps.

8. The apparatus of claim 6, wherein the clock recovery block comprises a phase lock loop that is configured to generate the clean clock signal from the rough clock signal, a divide-by-M frequency divider that is configured to divide a frequency of the clean clock signal by M, and a frequency difference detector that is configured to measure the difference in frequency between the output of the divide-by-M frequency divider and the reference clock, from which difference in frequency the control processor determines a corresponding clock rate from which the optical signal type of the received optical signal is determined.

9. The apparatus of claim 6, wherein the clock recovery block comprises a phase lock loop that is configured to generate the clean clock signal from the rough clock signal, and wherein the phase loop circuit comprises a divide-by-N frequency divider that receives as input the clean clock signal, and a phase frequency detector that is configured to receive an output of the divide-by-N frequency divider and to measure a rate difference between the output of the divide-by-N frequency divider and the reference clock, from which rate difference the control processor determines a corresponding clock rate from which the optical signal type of the received optical signal is determined.

10. The apparatus of claim 6, wherein the control processor is configured to perform the evaluate function with respect to one optical signal type in the stored list, and to repeat the evaluate function for other optical signal types in the list until a match is determined with an optical signal type in the list.

11. An apparatus comprising:

an optical receiver device configured to receive an optical signal and to convert the optical signal to an electrical signal;

an analog-to-digital converter configured to convert the electrical signal to a serial data stream of digital samples;

a demultiplexer configured to demultiplex the serial data stream to a parallel data stream and to obtain a rough clock signal from the serial data stream;

a clock recovery block that is configured to recover a clean clock signal from the rough clock signal; and a control processor that is configured to store a list of a plurality of possible optical signal types, to generate a difference between a frequency of the clean clock signal and a frequency of a reference clock, to evaluate the difference to determine a clock rate of the received optical signal and to identify an optical signal type of the received optical signal based on the clock rate;

wherein said control processor, based on the optical signal type determined for the received optical signal, is configured to select one of a plurality of traffic processing blocks to further process said electrical signal, and to select one of a plurality of performance monitoring blocks to monitor quality of said optical signal.

12. The apparatus of claim 11, wherein the control processor is configured to identify an optical signal type select from the group of: recover a clock signal for a SONET OC-192 type of optical signal, SDH STM-64, 10 Gigabit Ethernet having a bit rate of 10.325 Gbps, G.709 having a bit rate of 10.709 Gbps and 10 Gigabit Ethernet employing Forward Error Correction and having a bit rate of 11.090 Gbps.

13. The apparatus of claim 11, wherein the clock recovery block comprises a phase lock loop that is configured to generate the clean clock signal from the rough clock signal, a divide-by-M frequency divider that is configured to divide a frequency of the clean clock signal by M, and a frequency difference detector that is configured to measure the difference in frequency between the output of the divide-by-M frequency divider and the reference clock, from which difference in frequency the control processor determines a corresponding clock rate from which the optical signal type of the received optical signal is determined.

14. The apparatus of claim 11, wherein the clock recovery block comprises a phase lock loop that is configured to generate the clean clock signal from the rough clock signal, and wherein the phase loop circuit comprises a divide-by-N frequency divider that receives as input the clean clock signal, and a phase frequency detector that is configured to receive an output of the divide-by-N frequency divider and to measure a rate difference between the output of the divide-by-N frequency divider and the reference clock, from which rate difference the control processor determines a corresponding clock rate from which the optical signal type of the received optical signal is determined.

15. The apparatus of claim 11, wherein the control processor is configured to perform the evaluate function with respect to one optical signal type in the stored list, and to repeat the evaluate function for other optical signal types in the list until a match is determined with an optical signal type in the list.

* * * * *